United States Patent [19]
Tanaka

[11] Patent Number: 5,965,909
[45] Date of Patent: Oct. 12, 1999

[54] SEMICONDUCTOR DEVICE HAVING HIGH GATE TURN-ON VOLTAGE

[75] Inventor: Hitoshi Tanaka, Kawasaki, Japan

[73] Assignee: Fujitsu Limited, Kawasaki, Japan

[21] Appl. No.: 08/936,744

[22] Filed: Sep. 25, 1997

[30] Foreign Application Priority Data

Mar. 19, 1997 [JP] Japan .................................. 9-065672

[51] Int. Cl.⁶ .............................................. H01L 31/0328
[52] U.S. Cl. ........................ 257/192; 257/194; 257/190; 257/280
[58] Field of Search ................................ 257/190, 192, 257/194, 195, 200, 280, 615, 187

[56] References Cited

U.S. PATENT DOCUMENTS 5,504,353  4/1996  Kuzuhara ................................ 257/194
5,548,139  8/1996  Ando ...................................... 257/194

OTHER PUBLICATIONS

Elizabeth Glass et al. "A High Efficiency Complementary GaAs Power FET Technology for Single Supply Portable Application", IEEE, 1996.

*Primary Examiner*—Minh Loan Tran
*Attorney, Agent, or Firm*—Armstrong, Westerman, Hattori, McLeland & Naughton

[57] ABSTRACT

The semiconductor device comprises a substrate, a channel layer formed on the substrate, a first barrier layer formed on the channel layer, being an indirect transition semiconductor layer containing Al and P and being not lattice-matched with the substrate, and an electrode formed above the first barrier layer. The first barrier layer having a wide band gap and having a high barrier to electrons is formed below the electrodes, whereby a high gate turn-on voltage can be available.

13 Claims, 4 Drawing Sheets

ELECTRON ENERGY

SEMICONDUCTOR DEVICE HAVING HIGH GATE TURN-ON VOLTAGE

BACKGROUND OF THE INVENTION

The present invention relates to a semiconductor device, more specifically a semiconductor device whose gate turn-on voltage is high.

In terminals of communication movable body, such as portable telephones, etc. MESFETs using GaAs, which are capable of a high-speed operation, are used as parts of power amplifiers of the transmission units.

In the conventional MESFETs; however, a threshold voltage is lower than 0 V, and even with a gate voltage set at 0 V, drain current is not completely turned off, and a trace of drain leak current of tenth-order $\mu$A flows. Even a trace of drain leak current is a cause for short battery life for portable telephones, which are long in waiting state without communication (waiting time).

The drain leak current of the MESFET can be made null by applying a high negative voltage to the gate electrode, but to this end separate batteries for generating a negative voltage is necessary. Mounting a plurality of batteries causes volume increase and cost increase unpreferably in terms of properties of the movable body terminal.

In place of mounting extra batteries for generating the negative voltage, it can be proposed that a DC/DC converter is mounted for generating the negative voltage, but this is not preferable because more current than the drain leak current is consumed by the DC/DC converter.

Then, it is proposed that a switch transistor which operates at a positive voltage is inserted in the drain terminal of the MESFET, whereby the drain current is shut off.

However, when the switch transistor operates, and a current flows between the drain and the source, a voltage decrease takes place between the drain and the source, and the voltage decrease becomes larger as the flowing current is increased. Accordingly, a voltage to be applied to the drain electrode of the MESFET adversely lowers. To maintain the same output electric power as in the prior art, a voltage decrease must be supplied by increasing current. In addition, to decrease electric power consumption of the terminal of the communication movable body, the electric power source voltage is lowered, which makes the voltage decrease of the switch transistor more serious.

Under these circumstances a semiconductor device including the barrier layer of AlGaAs layer which is an indirect transition semiconductor layer to increase a threshold voltage to 0.5 V is proposed (Elizabeth Glass, Jon Abrokwah, Rudy Lucero, Eddie Spears, Jeff Rollman, Jenn-Hwa Huang, Bruce Bernhardt and Bill Ooms, "A HIGH EFFICIENCY COMPLEMENTARY GaAs POWER FET TECHNOLOGY FOR SINGLE SUPPLY PORTABLE APPLICATIONS," 1996 IEEE MTT-S Digest, pp. 1083–1086, 1996).

In the proposed semiconductor device the threshold voltage can be raised to about 0.5 V, which makes it possible to turn off the drain current without applying the negative voltage to the gate electrode.

However, in the proposed semiconductor device described above, when a gate turn on voltage, i.e., a gate voltage is set on increase, a voltage at which leak current starts to flow from the gate to the source is as low as 1.6 V. Accordingly, the drain current must be controlled in a 0.5–1.6 V gate voltage range, which makes the device inapplicable to various uses.

SUMMARY OF THE INVENTION

An object of the present invention is to provide a semiconductor device having a high gate turn-on voltage.

The above-described object is achieved by a semiconductor device comprising: a substrate; a channel layer formed on the substrate; a first barrier layer formed on the channel layer, being an indirect transition semiconductor layer containing Al and P, and being not lattice-matched with the substrate; and an electrode formed above the first barrier layer. The first barrier layer having a wide band gap and having a high barrier to electrons is formed below the electrodes, whereby a high gate turn-on voltage can be available.

In the above-described semiconductor device, it is preferable that the first barrier layer is an AlP layer, an AlInP layer, an AlGaP layer, or an AlGaInP layer.

In the above-described semiconductor device, it is preferable that the semiconductor device further comprises a second barrier layer formed on the first barrier layer and being substantially lattice-matched with the substrate.

In the above-described semiconductor device, it is preferable that a thickness of the first barrier layer is below a critical film thickness.

In the above-described semiconductor device, it is preferable that the channel layer is an InGaAs layer, and has a thickness below a critical film thickness.

In the above-described semiconductor device, it is preferable that the first barrier layer is not doped with an impurity.

DETAILED DESCRIPTION OF THE INVENTION

A First Embodiment

Figure 1:
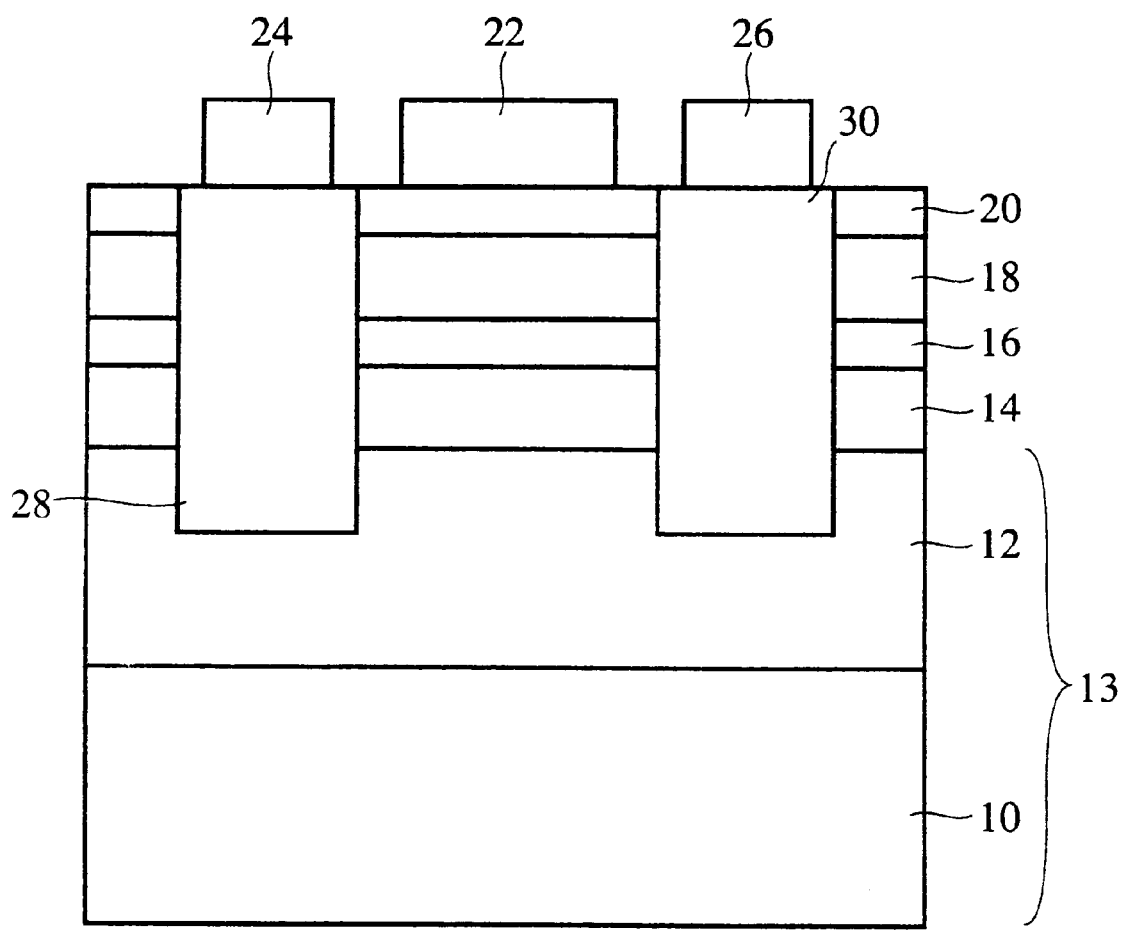
FIG. 1 is a sectional view of the semiconductor device according to the first embodiment of the present invention.
Figure 2:
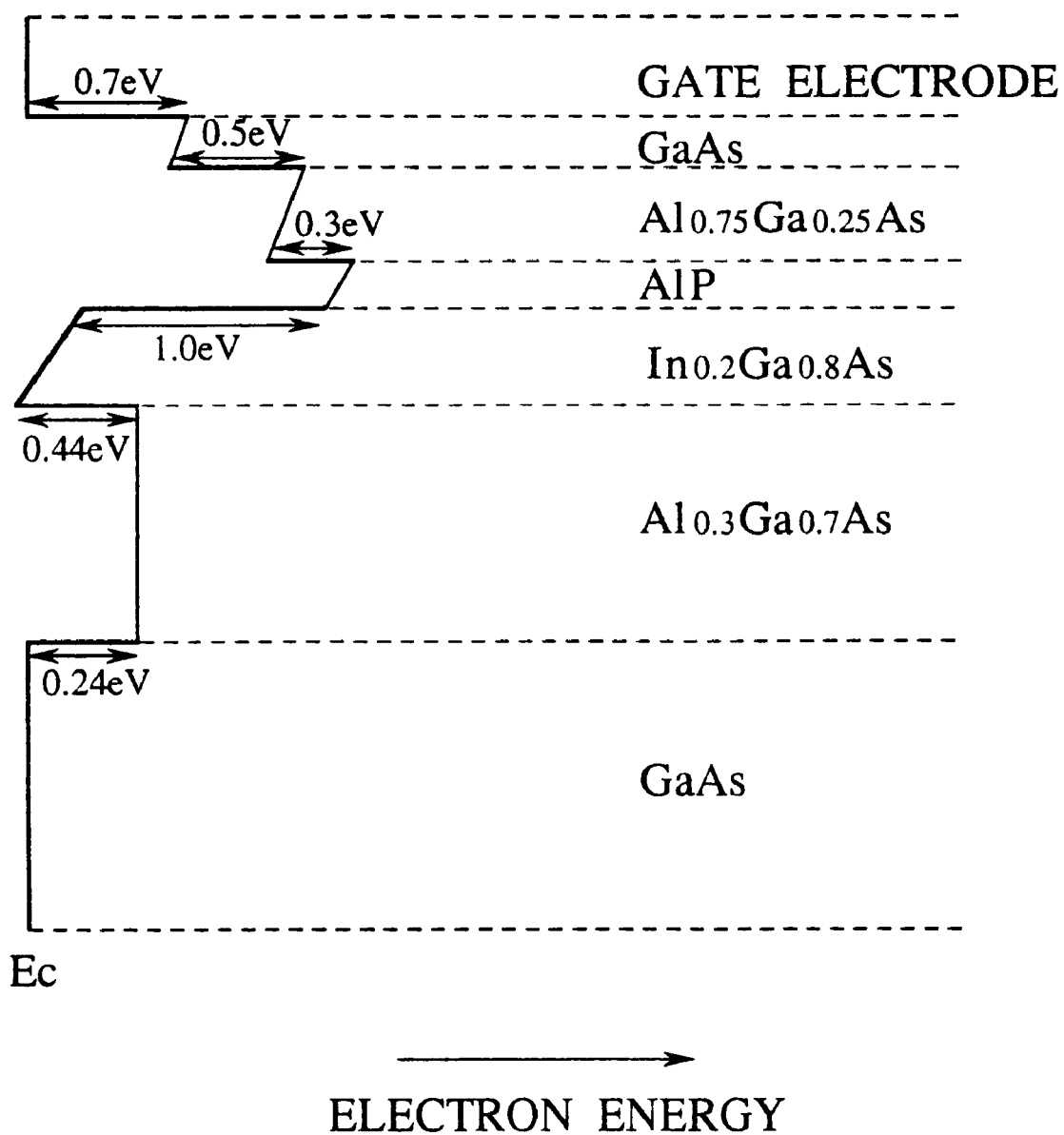
FIG. 2 is a graph of an energy band of the semiconductor device according to the first embodiment of the present invention.

The semiconductor device according to a first embodiment of the present invention will be explained with reference to FIGS. 1 and 2. FIG. 1 is a sectional view of the semiconductor device according to the present embodiment. FIG. 2 is a graph of an energy band of the semiconductor device according to the present embodiment.

As shown in FIG. 1, the semiconductor device according to the present embodiment is characterized in that a barrier layer 16 having a wide band gap and a high barrier of electrons is formed below a gate electrode 22.

A buffer layer 12 which is an about 500 nm-thickness $Al_xGa_{1-x}As$ layer whose an Al composition ratio (x) is 0.3 is epitaxially formed on a semi-insulating GaAs substrate 10. As shown in FIG. 2, an energy level of the semi-insulating GaAs substrate 10 is the energy level Ec which is the bottom conduction band. An energy level of the buffer layer 12 is higher by 0.24 eV than that of the semi-insulating GaAs substrate 10.

On this base substrate 13, a channel layer 14 of an $In_yGa_{1-y}As$ layer having a 0.2 In composition ratio (y) is epitaxially grown. Preferably the channel layer 14 has an about 14 nm-thickness so as to be thinner than a critical film thickness. An energy band of the channel layer 14 is lower by 0.44 eV than that of the buffer layer 12.

On the channel layer 14 the barrier layer 16 of an AlP layer is epitaxially grown. A critical film thickness is about 2 nm, and the barrier layer 16 preferably has a film thickness of, e.g., about 1 nm. The barrier layer 16 is an indirect transition semiconductor layer containing much Al, and can form a barrier whose energy level is higher by 1.0 eV than the channel layer 14. It is preferable that the barrier layer 16 is not doped with an impurity and has an impurity concentration of below $5 \times 10^{17}$ cm$^{-3}$. Generally an energy level of a bottom conduction band of the indirect transition semiconductor is at a position other than Γ point, but in the semiconductor device according to the present invention, because no current flows to the gate, a height of the barrier to electrons may be considered at Γ point. The graph of FIG. 2 shows energy bands at Γ point.

On the barrier layer 16 a barrier layer 18 of an $Al_xGa_{1-x}As$ layer having an about 25 nm-thickness and a 0.75 Al composition ratio (x) is epitaxially grown. An energy level of the barrier layer 18 is lower by 0.3 eV than that of the barrier layer 16.

On the barrier layer 18 an about 3 nm-thickness GaAs layer 20 for good contact with the respective electrodes is formed. The GaAs layer 20 has an energy level lower by 0.5 eV than the barrier layer 18.

A gate electrode 22 is formed on the GaAs layer 20. The gate electrode 22 has an energy level lower by 0.7 eV than the GaAs layer 20.

A source electrode 24 and a drain electrode 26 are formed on both sides of the gate electrode 22. Below the source electrode 24 and the drain electrode 26 ohmic regions 28, 30 heavily doped with an n-impurity are respectively formed, reaching the buffer layer 12.

As described above, according to the present embodiment, the barrier layer 16 having a wide band gap and having a high barrier to electrons is formed below the gate electrode 22, which permits the gate turn-on voltage to be increased to 1.7 V.

Then, the method for fabricating the semiconductor device according to the present embodiment will be explained.

First, the buffer layer 12 of an about 500 nm-thickness $Al_{0.3}Ga_{0.7}As$ layer is grown on the semi-insulating GaAs substrate 10 by MOVPE (Metal Organic Vapor Phase Epitaxial). The film forming conditions are an about 650° C. substrate temperature and an about 76 Torr film forming chamber pressure. A source gas for the Al is TMAL (Trimethylaluminum), and a source gas for the Ga is TMG (Trimethylgallium) or TEG (Triethylgallium). A source gas for the As is $AsH_3$.

Then, on the buffer layer 12 the channel layer 14 of an about 14 nm thickness $In_{0.2}Ga_{0.8}As$ layer is grown. The film forming conditions are an about 650° C. substrate temperature and an about 76 Torr film forming chamber pressure. A source gas for the In is TMI (Trimethylindium), and a source gas for the Ga is TMG or TEG. A source gas for the As is $AsH_3$.

Then, on the channel layer 14 the barrier layer 16 of an about 1 nm-thickness AlP layer is grown by MOVPE. The film forming conditions are an about 650° C. substrate temperature and an about 76 Torr film forming chamber pressure. A source gas for the Al is TMAl, and a source gas for the P is $PH_3$ (phosphine).

Then, on the barrier layer 16 the barrier layer 18 of an about 25 nm-thickness $Al_{0.75}Ga_{0.25}As$ layer is grown by MOVPE. The film forming conditions are an about 650° C. substrate temperature and an about 76 Torr film forming chamber pressure. A source gas for the Al is TMAL, and a source gas for the Ga is TMG or TEG. A source gas for the As is $AsH_3$.

Next, on the barrier layer 18 the GaAs layer 20 of an about 3 nm-thickness is grown by MOVPE. The film forming conditions are about 650° C. substrate temperature and an about 76 Torr film forming chamber pressure. A source gas for the Ga is TMG or TEG. A source gas for the As is $AsH_3$.

Then, on the barrier layer 18 Al is vapor deposited and patterned into a shape of the gate electrode by photolithography to form the gate electrode 22.

Next, with the gate electrode 22 as a mask, the ohmic regions 28, 30 which reach the buffer layer 12 are formed by implanting a high concentration of an n-impurity below in regions the source electrode 24 and the drain electrode 26 which will be formed in a later step.

Then, AuGe/Au is deposited and patterned in a shape of the source and the drain electrode by photolithography to form the source electrode 24 and the drain electrode 26.

The semiconductor device according to the present embodiment is thus fabricated.

A Second Embodiment

Figure 3:
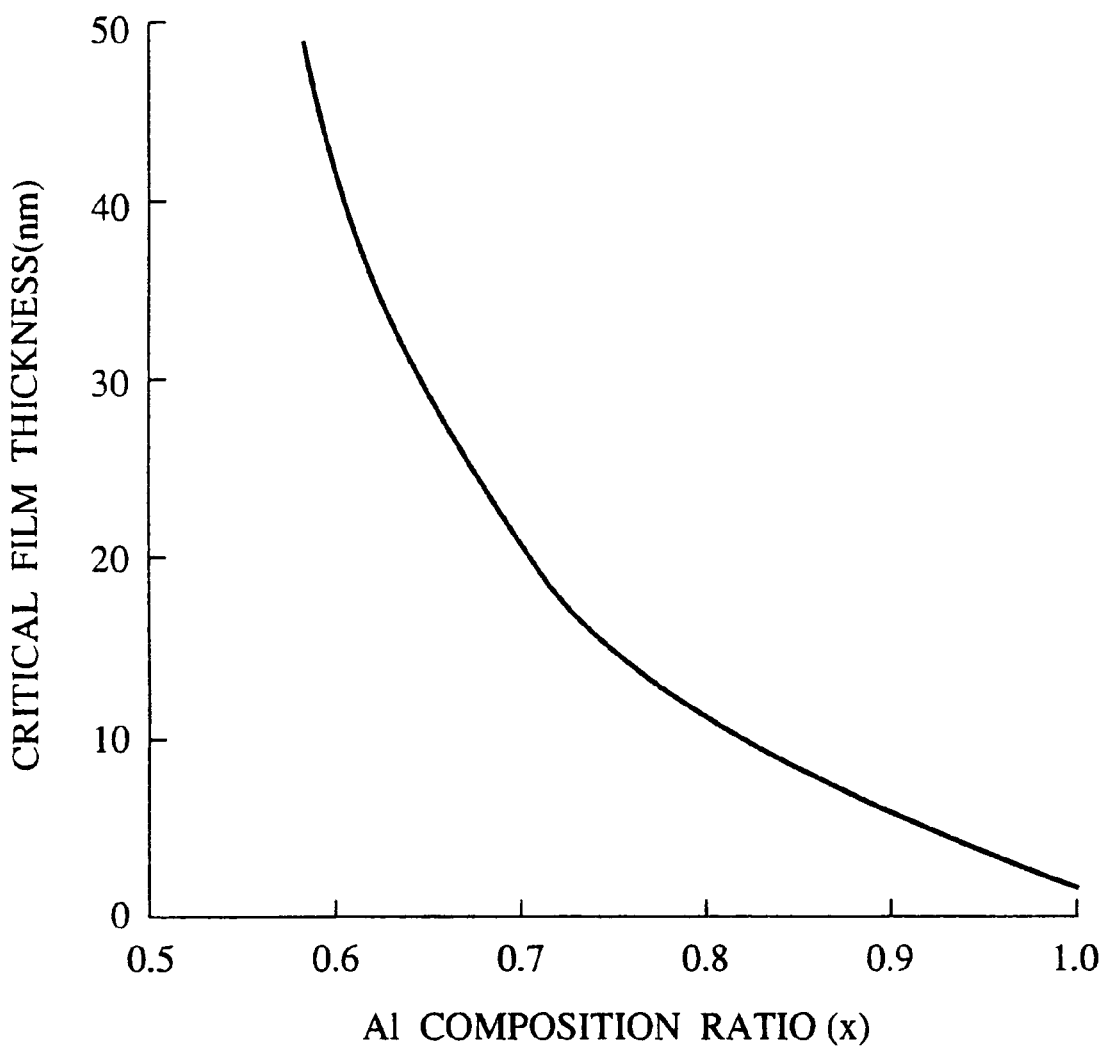
FIG. 3 is a graph showing a critical film thickness of the barrier layer of the semiconductor device according to the second embodiment of the present invention.
Figure 4:
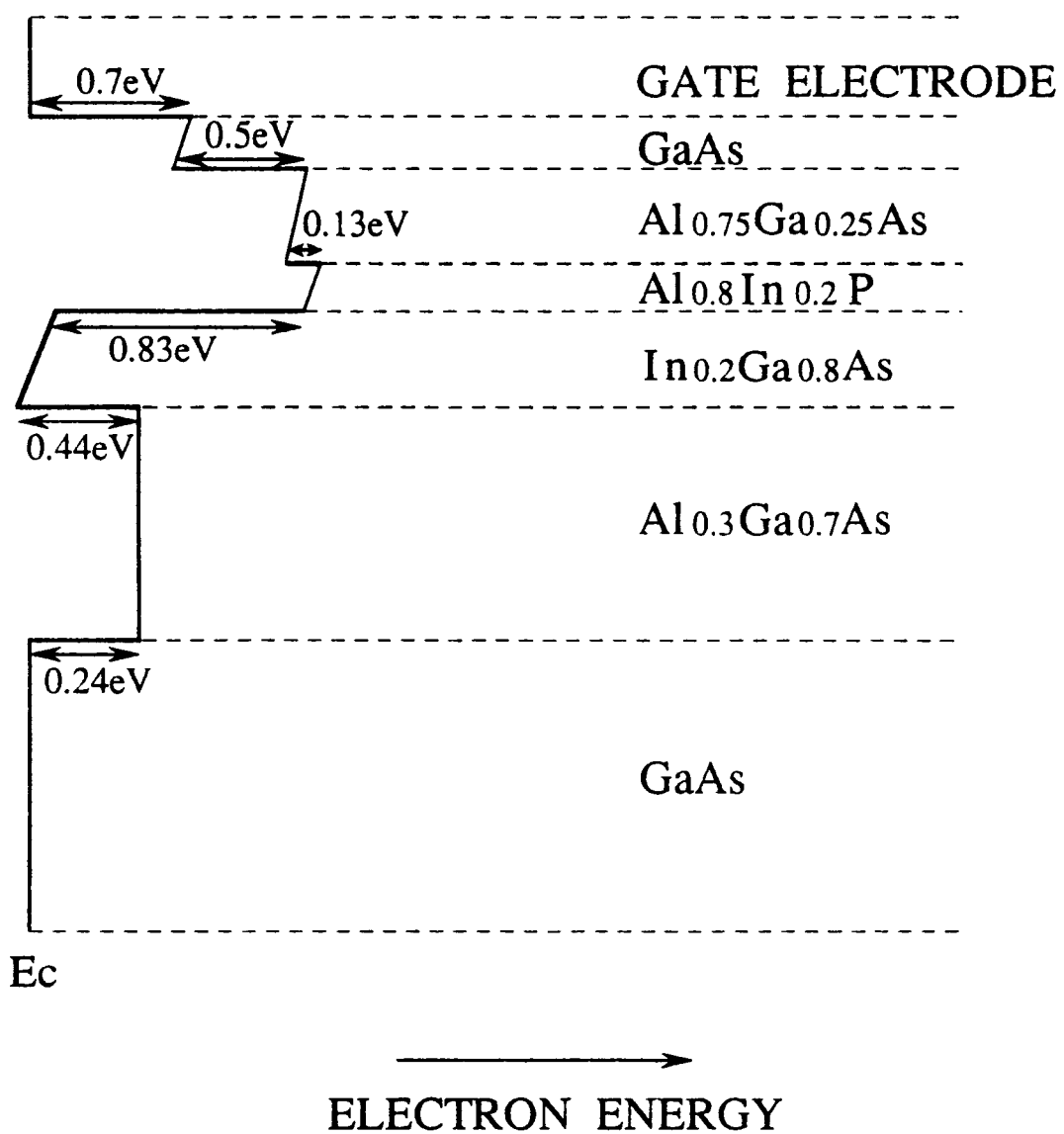
FIG. 4 is a graph of an energy band of the semiconductor device according to the second embodiment of the present invention.

The semiconductor device according to a second embodiment of the present invention will be explained with reference to FIGS. 1, 3 and 4. FIG. 3 is a graph of a critical film thickness of the barrier layer of the semiconductor device according to the present embodiment. FIG. 4 is a graph of energy bands of the semiconductor device according to the present embodiment. The same members of the semiconductor device according to the present embodiment as those of the semiconductor device according to the first embodiment are represented by the same reference numbers not to repeat their explanation and to simplify their explanation.

The semiconductor device according to the present embodiment and that according to the first embodiment are different from each other in the material and thickness of the barrier layers 16, 18 and are the same in the rest respects.

On a channel layer 14 a barrier layer 16 of an $Al_xIn_{1-x}P$ layer having a 0.8 Al composition ratio (x) is epitaxially grown. The barrier layer 16, which contains In, has a lattice constant approximate to that of a semi-insulating GaAs substrate 10 and can be thick. As shown in FIG. 3, when an Al composition ratio (x) is 0.8, a critical film thickness is as large as about 11 nm, and the barrier layer 16 preferably has a film thickness of, e.g., about 10 nm. The thickness of the barrier layer 16 as large as about 10 nm makes it possible to make tunnel current small. The barrier layer 16, which is an indirect transition semiconductor layer having a high Al composition ratio, can be a barrier having a higher energy level even by 0.83 eV than the channel layer 14. The Al composition ratio (x) may be in a range which is above 0.5 and below 1. It is preferable that the barrier layer 16 has an impurity concentration of below $5 \times 10^{17}$ cm$^{-3}$ without doping an impurity. As in the semiconductor device according to the first embodiment, the graph of FIG. 4 shows an energy band at Γ point.

On the barrier layer 16 a barrier layer 18 of an about 15 nm-thickness $Al_xGa_{1-x}As$ layer having a 0.75 Al composition ratio (x) is epitaxially grown. The barrier layer 18 has an energy level which is lower by 0.13 eV than the barrier 16.

As described above, according to the present embodiment, the barrier layer 16 having a wide band gap and is a high barrier to electrons is formed below the gate electrode 22, which permits a gate turn-on voltage to be increased to 1.8 V. The large thickness of the barrier layer 16 allows tunnel current to be small.

Then, the method for fabricating the semiconductor device according to the present embodiment will be explained. The method for fabricating the semiconductor device according to the present embodiment is the same as the method for fabricating the semiconductor device according to the first embodiment except that the barrier layers 16, 18 are formed in different ways from those of the barrier layers 16, 18 of the first embodiment.

After the channel layer 14 is formed in the same way as in the method for fabricating the semiconductor device according to the first embodiment, the barrier layer 16 of an about 10 nm-thickness $Al_{0.8}In_{0.2}P$ layer is grown by MOVPE on the channel layer 14. The film forming conditions are an about 650° C. substrate temperature and an about 76 Torr film forming chamber pressure. A source gas for the Al is TMAL. A source gas for the In is TMI. A source gas for the P is $PH_3$.

Then, on the barrier layer 16 the barrier 18 of an about 15 nm-thickness $Al_{0.75}Ga_{0.25}As$ layer is grown by MOVPE. The film forming conditions are an about 650° C. substrate temperature and an about 76 Torr film forming chamber pressure. A source gas for the Al is TMAL. A source gas for the Ga is TMG or TEG. A source gas for the As is $AsH_3$.

This step is followed by the same steps as those of the method for fabricating the semiconductor device according to the first embodiment.

The semiconductor device according to the present embodiment is thus fabricated.

Modification

The present invention is not limited to the above-described embodiment and can cover various modifications.

For example, in the first embodiment, the barrier layer 16 may be an $Al_xGa_{1-x}P$ layer having an Al composition ratio (x) which is above 0 and below 1 exclusive of 1. A film thickness of the barrier layer 16 is preferably about 1 nm. For example, when the barrier layer 16 is an $Al_xGa_{1-x}P$ layer having a 0.5 Al composition ratio (x) and an about 1 nm-thickness, the barrier layer 16 can form a barrier whose energy level is higher even by 0.86 eV than the channel layer.

In the second embodiment, the barrier layer 16 may be $(Al_xGa_{1-x})_yIn_{1-y}P$ layer having a 0.8 Al composition ratio (x) and a 0.8 In composition ratio (y). The barrier layer 16 preferably has an about 10 nm thickness. In this case, the barrier layer 16 can be a barrier whose energy level is higher by 0.80 eV than the channel layer.

In the first and the second embodiments, the barrier layer 18 may be omitted as long as the barrier layer 16 alone can do the required function of the barrier layer.

What is claimed is:

1. A semiconductor device comprising:

a substrate;

a channel layer formed on the substrate;

a first barrier layer formed on the channel layer, being an indirect transition semiconductor layer containing Al and P, and being not lattice-matched with the substrate; and an electrode formed above the first barrier layer.

2. A semiconductor device according to claim 1, wherein the first barrier layer is an AlP layer, an AlInP layer, an AlGaP layer, or an AlGaInP layer.

3. A semiconductor device according to claim 2, wherein the channel layer is an InGaAs layer, and has a thickness below a critical film thickness.

4. A semiconductor device according to claim 2, wherein the first barrier layer is not doped with an impurity.

5. A semiconductor device according to claim 1, further comprising a second barrier layer formed on the first barrier layer and being substantially lattice-matched with the substrate.

6. A semiconductor device according to claim 5, wherein a thickness of the first barrier layer is below a critical film thickness.

7. A semiconductor device according to claim 5, wherein the channel layer is an InGaAs layer, and has a thickness below a critical film thickness.

8. A semiconductor device according to claim 5, wherein the first barrier layer is not doped with an impurity.

9. A semiconductor device according to claim 1, wherein a thickness of the first barrier layer is below a critical film thickness.

10. A semiconductor device according to claim 9, wherein the channel layer is an InGaAs layer, and has a thickness below a critical film thickness.

11. A semiconductor device according to claim 9, wherein the first barrier layer is not doped with an impurity.

12. A semiconductor device according to claim 1, wherein the channel layer is an InGaAs layer, and has a thickness below a critical film thickness.

13. A semiconductor device according to claim 1, wherein the first barrier layer is not doped with an impurity.

* * * * *